INVENTOR.
ROBERT L. COLE

INVENTOR.
ROBERT L. COLE

April 28, 1970 R. L. COLE 3,509,467

MULTIBAND ELECTRONIC TUNER

Filed Sept. 20, 1967 7 Sheets-Sheet 3

INVENTOR.
ROBERT L. COLE

April 28, 1970 R. L. COLE 3,509,467

MULTIBAND ELECTRONIC TUNER

Filed Sept. 20, 1967 7 Sheets-Sheet 4

INVENTOR.
ROBERT L. COLE

BY [signature] ATTY.

April 28, 1970 R. L. COLE 3,509,467

MULTIBAND ELECTRONIC TUNER

Filed Sept. 20, 1967 7 Sheets-Sheet 5

INVENTOR.
ROBERT L. COLE

INVENTOR.
ROBERT L. COLE
BY [signature] ATTY

INVENTOR.
ROBERT L. COLE

United States Patent Office 3,509,467
Patented Apr. 28, 1970

3,509,467
MULTIBAND ELECTRONIC TUNER
Robert L. Cole, Macedon, N.Y., assignor to General Dynamics Corporation, a corporation of Delaware
Filed Sept. 20, 1967, Ser. No. 669,117
Int. Cl. H04b 1/16
U.S. Cl. 325—452 9 Claims

ABSTRACT OF THE DISCLOSURE

An improved electronic tuner is disclosed herein which includes a frame on which is fixedly mounted a printed circuit board. The capacitors and inductors which provide the tuned circuits in each band are located in separate rows which extend laterally across the board. Each row occupies a successive region from the forward to the rear end of the board. The circuitry for each band is also separately located on the board within the region allocated thereto. A carriage is mounted within the frame on lead screws which are disposed along opposite edges of the frame. An active circuit board is carried underneath the carriage and is contained within the frame. Active circuits are amplifiers and oscillators which, when connected to the passive circuits for each band, are tuned to the frequency of that band. Contact elements extending from the active board make contact with cooperating contact elements on the fixed board so as to provide the requisite connections. Contacts, in addition, are provided in each band region which cooperate with a motor which drives the lead screws so as to move the carriage to the desired position for selecting the desired band.

The present invention relates to electronic tuners and particularly to a multiband high frequency electronic tuner of modular construction.

Existing multiband high frequency tuners are generally in the form of rotatable turrets or stacked circuit assemblages which are disadvantageous in that they require a large amount of space, especially when a large number of frequency bands are required. Such existing tuners are difficult to maintain, for example, disassembly of the entire tuner being required for maintenance and sometimes even for adjusting trimming capacitors and inductors. Further disadvantages lie in the electronic design of existing tuners. In some instances, many radio frequency connections are required, as are long circuit paths which carry radio frequency currents. These electrical disadvantages can result in instabilities, particularly in the high gain amplifiers and also in the frequency stability of oscillator circuits contained in the tuners. In addition to the foregoing disadvantages, and perhaps more significant, is the high production cost of existing tuners.

Accordingly, it is an object of the present invention to provide an improved multiband tuner wherein the foregoing disadvantages are substantially eliminated.

It is a further object of the invention to provide an improved multiband high frequency tuner which is entirely self-contained in a modular unit.

It is a still further object of the present invention to provide an improved multiband tuner which lends itself easily to changes in the number of bands without requiring redesign of circuits or tuner components.

It is a still further object of the present invention to provide an improved multiband tuner having few mechanical movements and switching contacts.

It is a still further object of the present invention to provide an improved multiband tuner having easy access to the components thereof for their adjustment and maintenance.

Briefly described, a tuner embodying the invention includes a rectangular frame in which there is mounted a fixed printed circuit board carrying the passive components for different ones of the tuner bands in different rows, each row being disposed in a different region extending along the tuner from the front to the rear thereof. In other words, there are as many rows as there are bands in the tuner. A carriage is mounted in the frame so as to bridge the frame from one side thereof to the other. The carriage is also movable between the forward and rear ends of the board. Depending from the frame and disposed within the confines thereof is an active printed circuit board containing circuitry which cooperates with the passive circuits in each row to define radio frequency amplifiers and/or oscillators for each band. Cooperating contact elements on the carriage board and on the fixed board provide selective connections as the carriage moves. Contact elements are also provided which cooperate with a motor and gearing mechanism which cooperates also with control circuitry for moving the carriage so as to select the desired tuner band.

The invention itself, both as to its organization and method of operation, as well as additional objects and advantages thereof will become more readily apparent from a reading of the following description in connection with the accompanying drawings in which.

Figure 1:
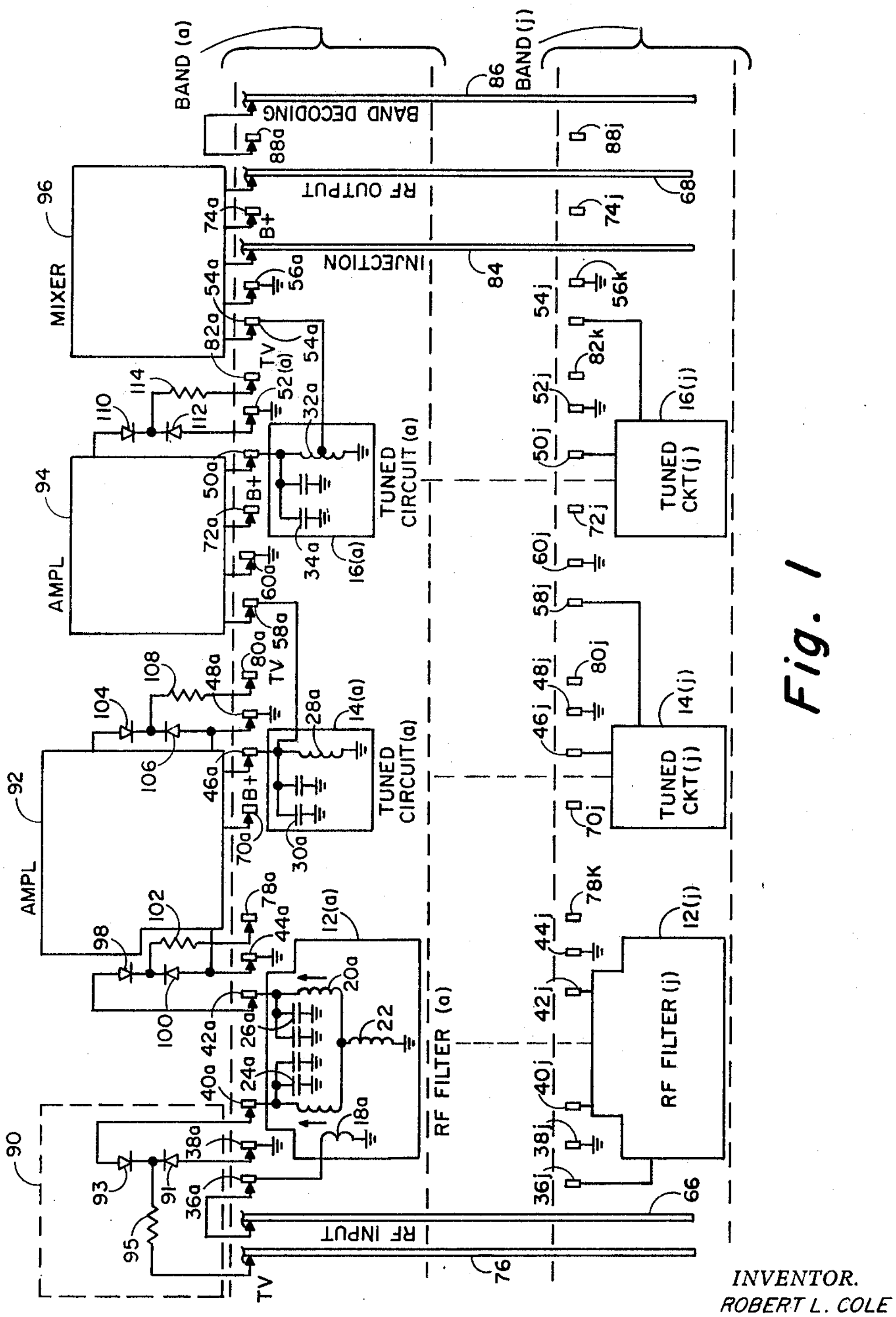
FIG. 1 is a block diagram partially in schematic form of the electronic components of a tuner embodying the invention.

Referring more particularly to FIG. 1, there is shown in schematic form a ten-band tuner embodying the invention. Each band is defined by a plurality of inductors and capacitors which are connected to form an RF filter 12, a first tuned circuit 14, and a second tuned circuit 16. The circuits for band *a* are designated by reference numerals having the letter *a*, while the filter and tuned circuits for the tenth band are designated by the same reference numerals with the letter *j* appended thereto. Specifically, the RF filter **12*a* includes an input transformer 18*a*, an output inductor 20, and another inductor 22 which form a "T" network. This network is tuned by a first pair of capacitors 24 and a second pair of capacitors 26**.

The first tuned circuit 14 includes an inductor 28 and a pair of tuning capacitors 30. The second tuned circuit includes a tapped inductor 32 and a pair of tuning capacitors 34. The capacitors 24, 26, 30 and 34 may be adjustable. Since the elements of the filter 12 and the tuned circuits 14 and 16 are passive, as opposed to active elements, such as diodes and transistors, they will be referred to as such hereinafter. The filter 12 and tuned circuits 14 and 16 of each band are shown between pairs of dotted lines disposed in successive rows to correspond to their layout on the printed circuit board in the tuner, as also will become apparent hereinafter.

Associated with each band are individual contact elements. The input to the RF filter is by way of a contact element 36. Next to the latter contact element is a grounded contact element 38. Another input contact element 40 is connected to the junction of the secondary of transformer 18 and the capacitor 24. An output contact element 42 is connected to the junction of the capactor 26 and the inductor 20. A grounded output contact element 44 is also provided. A pair of contact elements 46 and 48, one of which 48 is grounded, are provided for the tuned circuit 14. Similarly, contact elements 50 and 52, the latter of which is grounded, are provided for the tuned circuit 16. The tap on the inductor 32 is connected to a contact element 54 and a cooperating grounded contact element 56 is also provided. The latter contact elements 54*a* and 56*a* are outputs from the final tuned circuit 16. Similarly, output contact elements 58 and 60, the latter of which is grounded, are output contact elements from the first tuned circuit 14. Inasmuch as the contact elements for each band correspond to each other, they are shown in the drawing with the band designating letter *a–j*. Only the first band (band *a*) and the tenth band (band *j*) are shown to simplify the illustration.

Figure 2:
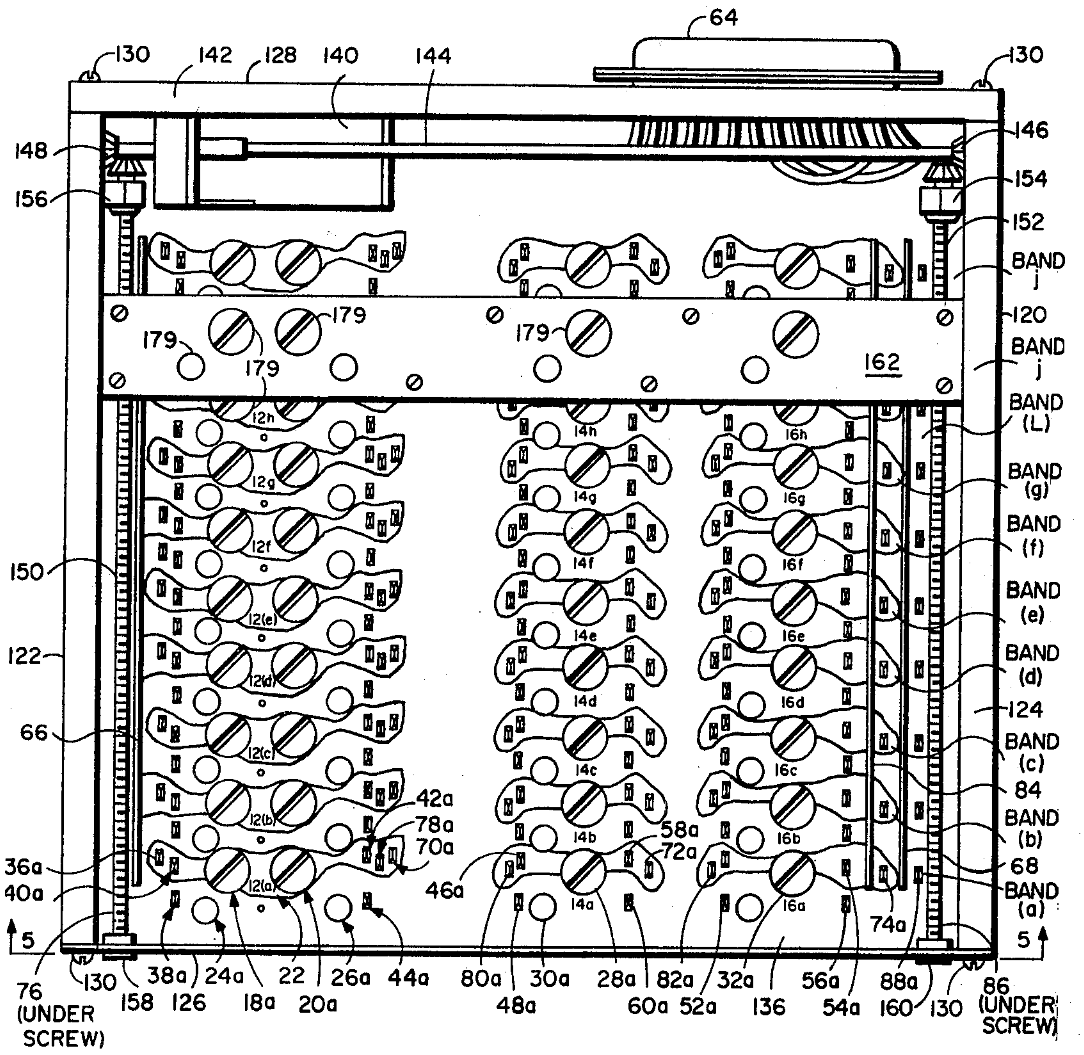
FIG. 2 is a top view of the tuner shown in FIG. 1 with the top cover thereof removed.

Input and operating voltages are also applied to the circuits by way of contact elements which are shown in FIG. 1. These contact elements are connected to a connector 64 which is wired to the conductors on printed circuit board (FIG. 2). Of course, output voltages are derived by way of contact elements. Contact elements which function in the selection of the desired band are also provided. These contact elements are shown schematically in FIG. 1. With regard to the input signals, the RF input, say from an antenna, is applied to a contact element in the form of a contact strip 66 which extends from the forward to the rear of the board. RF output voltages are taken from a similar contact strip 68. Operating voltages indicated as B+ are applied via contact elements 70, 72 and 74 in each band. The active circuits include a number of voltage variable capacitor diodes. The tuning voltages for these capacitor diodes are applied via a contact strip 76 which extends from the forward to the rear ends of the board and also at contact elements 78, 80 and 82 in each band. Tuning of the amplifiers including the passive circuits connected thereto in each band is obtained within the band by the application of the tuning voltages. These are generated by external tuning circuits, such as may be contained within a frequency synthesizer in the radio. Injection signals for the mixer of the active circuits is applied via a contact strip 84. Band selection or decoding contacts are provided by a contact strip 86 and by contact elements 88 in each band.

The active circuits of the tuner which are mounted on active circuit boards are movable into cooperating relationship with the passive circuits of the bands *a–j*, and are an input coupling circuit 90, a first RF amplifier 92, a second RF amplifier 94 and a mixer 96. Inasmuch as the amplifier circuits 92 and 94 and mixer 96 may be field effect transistor circuits of known design, they are not shown in detail. The input circuit 90 contains a pair of voltage variable capacitors 91 and 93. Tuning voltages are applied to their junction by way of a resistor 95. The amplifier 92 includes an input tuned circuit also having a pair of voltage variable capacitors 98 and 100. Tuning voltage to these capacitors is applied by way of a resistor 102. The output tuned circuit of the amplifier contains another pair of voltage variable capacitors 104 and 106. Tuning voltage to these capactiors is applied by way of a resistor 108. The output circuit of the second amplifier 94 also contains a pair of voltage variable capacitors 110 and 112, tuning voltage to which is supplied by way of a resistor 114. Depending from the active circuits are contact elements which are shown as arrows. These contact elements make contact with the corresponding contact elements and contact strips. The fact that the active circuit contact elements are movable is schematically illustrated by their designation as arrowheads rather than blocks or strips in the drawing.

The mechanical structure of the tuner is shown in FIGS. 2–5. The components of the passive and active circuits are designated in these figs. by the same reference numerals as used in FIG. 1. In other words, the components of the passive circuits in band (*a*) are designated by reference numerals having the postscript (*a*), while those in the other bands are designated with like reference numerals having postscripts *b–j*.

Figure 3:
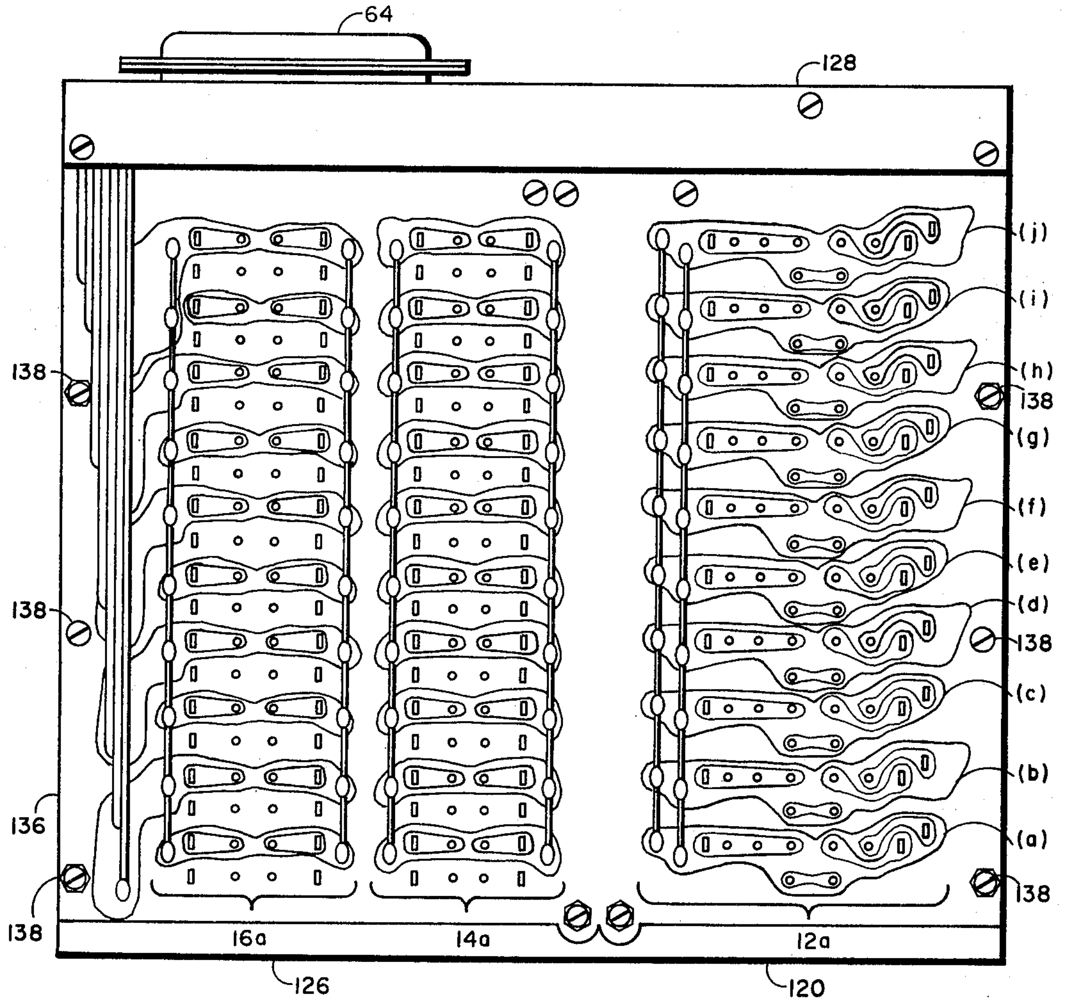
FIG. 3 is a bottom view of the tuner shown in FIG. 1 with the bottom cover thereof removed.
Figure 4:
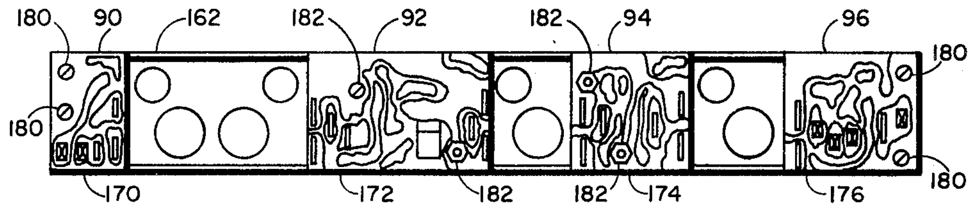
FIG. 4 is a bottom view of the carriage of the tuner shown in FIG. 1, the view being taken along the line 4—4 of FIG. 5 when viewed in the direction of the arrows which extend perpendicular to the line 4—4.
Figure 5:
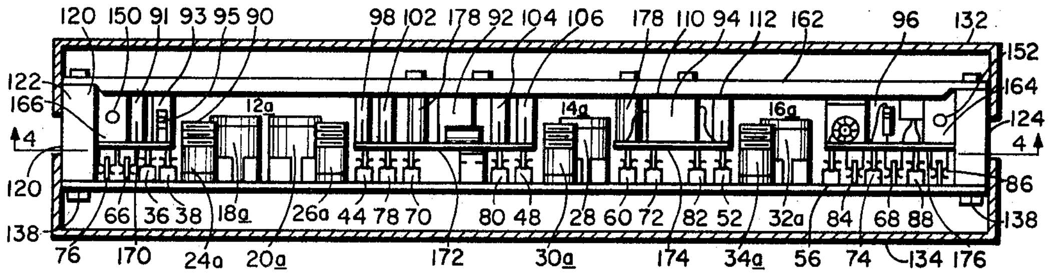
FIG. 5 is a front sectional view of the tuner shown in FIG. 1, the view being taken along the line 5—5 in FIG. 2 when viewed in the direction of the arrows extending perpendicular to that line.

Referring now to FIGS. 2–5, the tuner is a rectangular package, the parts of which are mounted on a rectangular frame 120. The frame contains left and right side rails 122 and 124 and front and rear plates 126 and 128. The plates are held to the rails by screws 130. Not shown in FIGS. 2 and 3, but shown in FIG. 5 are top and bottom cover plates 132 and 134 which may be used to enclose the frame and thereby form a modular package containing the entire tuner. The connector 64 mounted on the rear plate 128 provides all of the connections to the tuner. It is an important feature of the invention to provide a tuner having this modular configuration which lends itself to use in miniaturized radio equipment, such as mobile and packset radios. The top and bottom covers 132 and 134 are easily removed for maintenance service.

A passive circuit board 136 is attached, as by screws 138, to the bottom of the frame 120 at the side rails (see FIG. 3). The passive circuit components which provide band (*a*) tuning are shown extending laterally across the board 136 between the rails 122 and 124 in separate rows. Thus, the first rows of components is disposed in the region labeled band (*a*), the second band in region (*b*), and so forth through band (*j*). The RF filters 12*a* to *j* and tuned circuits 14*a* to *j* and the other tuned circuits 16*a* to *j* occupy side-by-side positions in the rows allocated to their respective bands. It will be noted that the current paths provided by the printed wiring are substantially in a straight line paths with minimum lead lengths and feed connections. This reduces RF signal leakages and increases stability of the circuits. It will also be noted, especially from FIG. 5, that space is provided between the filter circuits and the tuned circuits 12, 14 and 16 and between the rails 122 and 124 and the circuits 12 and 16. This space is effectively utilized by the active circuits, as will become more apparent hereinafter, so as to lend itself to a compact modular structure.

A motor 140 is mounted on the passive board 136 adjacent the rear plate 128 (FIG. 2). A gear box 142 is disposed adjacent this motor and a drive shaft 144, driven by the motor through the gears in the box, is journaled in bearings mounted in each of the side rails 122 and 124. Bevel gears 146 and 148 on the ends of the shaft 144 drive lead screws 150 and 152 which are journaled in bushings 154 and 156 mounted on the side rails 120 and 122 and in bearings 158 and 160 in the front plate 126.

A carriage 162 bridges the frame between the side rails 120 and 122. This carriage is screw mounted in blocks 164 and 166, desirably of insulating material, such as nylon. The lead screws 150 and 152 extend through threaded openings in these blocks. Thus, as the motor turns, the carriage will be translated linearly over the passive board between the front and rear plates 126 and 128. Motor control circuits, which will be described hereinafter in connection with FIG. 6, are operative to stop the carriage over the row of passive circuits for the selected frequency band.

The active circuits are carried beneath the carriage. Specifically, the active circuits are mounted on four active circuit boards 170, 172, 174 and 176. These boards are connected to the carriage by way of posts 178, some of which are shown in FIG. 5. The outer boards 170 and 176 are cantilever mounted on the blocks 164 and 166 by mounting screws 180 (FIG. 4). Mounting screws 182 which connect the boards 172 and 174 to the posts 178 are also shown in FIG. 4. Openings 179 are provided in the carriage. Trimming tools may be inserted through these openings for the purpose of adjusting or trimming the inductors and capacitors mounted on the passive board. The active input amplifier and mixer circuits which are mounted on the boards 170, 172, 174 and 176 and the boards themselves occupy the space remaining between the circuit elements on the passive board 136 and also between the circuit elements and the side rails 122 and 124 of the frame 120, thus permitting the space within the confines of the frame to be efficiently utilized and affording the modular construction which is a feature of the invention.

The board 170 carries the active input circuit 90. The board 172 carries the first radio frequency amplifier 92. The board 174 carries the second radio frequency amplifier 94. The mixer 96 is carried on the board 176. As shown in FIG. 5, contacts extending from these active boards 170, 172, 174 and 176 make connections with contact elements which extend upwardly from the passive board 136. These active board contacts are designated with numerals 76, 66, 36, 38, 40, etc., corresponding to the contact elements which extend from the passive board (FIG. 1).

Figure 6:
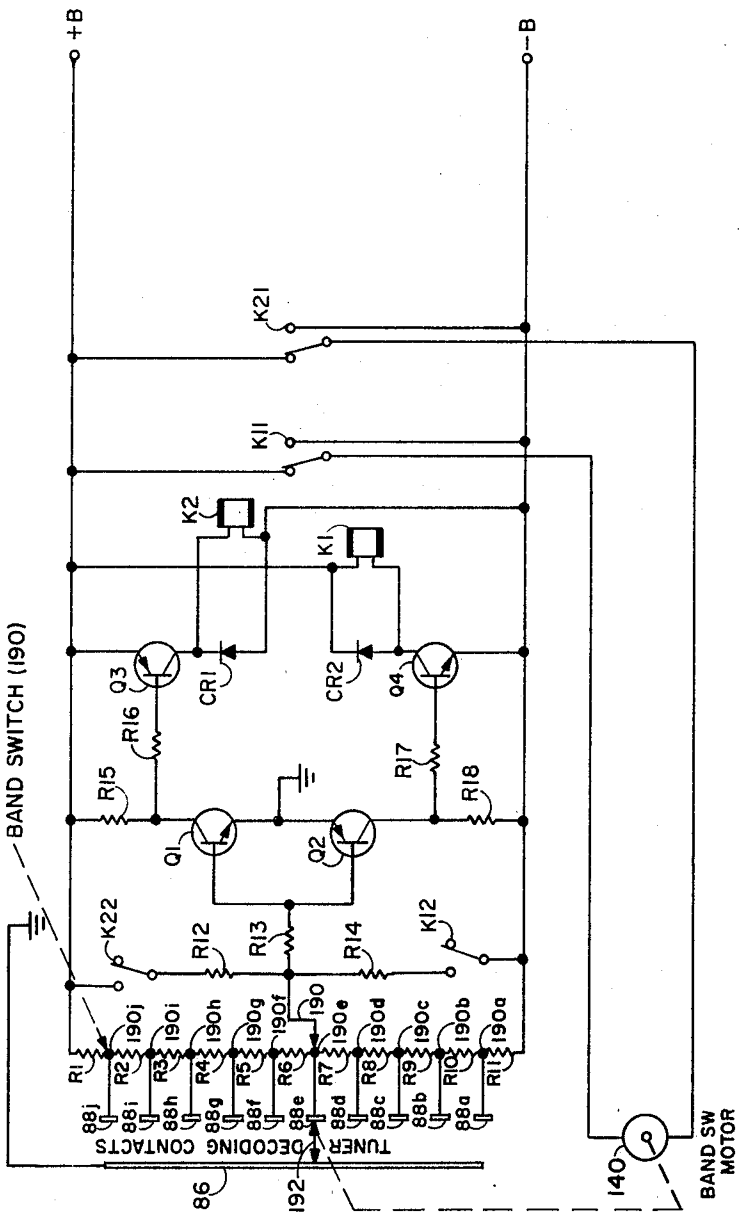
FIG. 6 is a schematic diagram of the band selection control circuits used in the tuner shown in FIGS. 1–5.

FIG. 6 shows the contact rail 86 and the contacts 88*a–j*, which are shown in FIG. 1, together with the motor 140 and the control circuits. A band switch 190, having ten contacts 190*a*–190*j*, is used to control the motor so as to move the carriage and select the desired band. This band switch may be mechanically coupled to the frequency or tuning control of the radio which employs the tuner. A plurality of resistors R1–R11 are connected through and between the contacts 190*a*–190*j*. Each contact 190*a*–190*j* is connected to a corresponding contact element 88*a*–88*j* which is disposed in the row allocated to a different one of the bands on the passive board 136 (FIG. 2). A switch connection 192 which is made through the contact element on the board 176 and through a printed circuit in the board itself provides connection between the contact elements 88*a*–88*j* and the contact strip 86. Operating voltage obtained from sources +B and −B of positive or negative voltage, each returned to ground, are applied to each end of the series connected chain of resistors R1–R11. The direction of current flow through the motor is determined by the position of the contacts K11 and K21 of a pair of motor controlling relays K1 and K2. The relays are illustrated in their de-energized condition which occurs when the motor 140 has driven the bridging connection 192 to the desired position and the active circuits are properly located in contact with the terminals of the passive circuits of the desired band. When the switch 190 position and the bridging contact position correspond, the movable element of the switch is connected to ground, thereby cutting off transistors Q1 and Q2 which are coupled through relay drive circuits including transistors Q3 and Q4 to the relays K1 and K2. Should a new band be selected, a positive or negative voltage will be applied to the bases of the transistors Q1 or Q2 via the resistor R13, depending upon the relative position of the movable contact of the switch 190 and the bridging connection 192. If the voltage is negative with respect to ground, the PNP transistor Q2 will conduct, thus making the NPN transistor Q4 conductive. Current then flows through the winding of the relay K1 causing its contact K11 to pull in. Current then flows between the source at +B and the source at −B through the motor which drives the motor over the shortest distance to close the gap between the movable contact of the switch 190 and the bridging connection 192. Contact K12 of the relay K1 also closes, thereby continuously applying a negative voltage to maintain the transistor Q2 pulled in, notwithstanding that the connection to ground via the bridging connection 192 is lost as the bridging connection moves across the space between the contacts 88*a*–88*j*.

Of course, if the relative position of the movable contact of the switch 190 and the bridging connection 192 is reversed, the transistors Q1 and Q3 become conductive so as to pull in the relay K2. This causes current to flow through the motor 140 in the reverse direction so as to translate the carriage in the opposite direction to the proper position.

The motor control circuits may be mounted either on the passive board or externally on the tuner, as desired.

Figure 7:
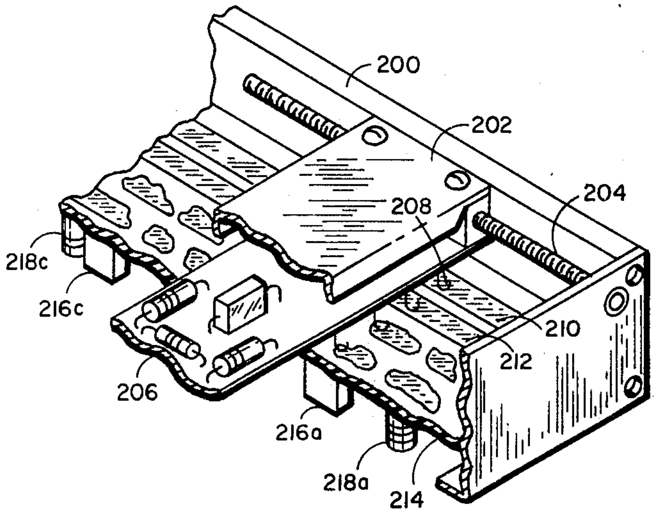
FIG. 7 is a fragmentary prospective view of a tuner similar to the tuner shown in FIGS. 1–6, but in accordance with another embodiment of the invention.

Referring to FIG. 7, the tuner shown therein includes a rectangular frame 200, similar to the frame 120 shown in FIGS. 1–5. A carriage 202, similar to the carriage 162, is mounted on lead screws, one of which 204 is shown. A single active circuit board 206 on which active circuits similar to the amplifier, oscillator and input circuits shown in FIGS. 1–5 is mounted beneath the carriage. The components of the active circuits are mounted on the side of the active board 206 facing the underside of the carriage. Contact elements 208 depend from the active circuit board and make contact with printed circuit contacts, such as the strips 210 and 212 which are printed directly on the side of a passive board 214 which faces the underside of the active board 206. The passive circuit elements, such as the inductors 216 and capacitors 218 are mounted within the confines of the frame 200, but on the side of the active board opposite to the side thereof which faces the active board 206. Again, the passive circuits allocated to each band are disposed in their respective rows which extend laterally across the passive circuit board 214. The tuner shown in FIG. 7 like the tuner shown in FIGS. 1–5 utilizes effectively all of the available space within the confines of the frame.

From the foregoing descriptions it will be apparent that there has been provided an improved multiband high frequency tuner especially suitable for use in high frequency radio sets, such as may be tuned from 1.5 Hz. to 30 Hz. It will be apparent to those skilled in the art that variations and modifications of the herein described tuner may be readily accommodated. For example, if a wider frequency range is desired, a lengthened passive board containing additional passive circuits may be used. Conversely, if the frequency range is abbreviated or if a broader bandwidth in each band is used, the number of rows of passive circuits may be reduced. Accordingly, the foregoing description should be taken merely as illustrative and not in any limiting sense.

What is claimed is:

1. A tuner for high frequency radio apparatus which is adapted to be operated in a plurality of different frequency bands over the high frequency range, said tuner comprising (a) a plurality of active high frequency circuits,
(b) a plurality of groups of passive high frequency circuits each corresponding to a different one of said bands, each group including a plurality of different tuned circuits,
(c) a frame,
(d) a circuit board carrying said group of passive circuits mounted in said frame,
(e) each of said groups being disposed in separate regions extending laterally of said frame, and each of said tuned circuits which are cooperative with the same active circuit having the same spaced relationship within the region occupied by their respective groups,
(f) a carriage disposed laterally across said frame,
(g) means mounting said carriage in said frame for movement longitudinally of said frame to positions corresponding to selected ones of said lateral regions,
(h) a circuit board carrying said active circuits depending from said carriage and disposed adjacent said passive circuit board,
(i) said plurality of active circuits being disposed in separate regions of said active board and with similar spaced relationship to the passive circuits corresponding thereto,
(j) said passive circuit board having contact elements thereon, and (k) contact elements also depending from said active circuit board for engaging the contact elements of the passive circuits cooperative therewith.

2. The invention as set forth in claim 1 including an electrical motor coupled to said carriage, a plurality of contact elements on said passive board each disposed in a different one of said regions, a contact element carried on said active board in position corresponding to said last named contact elements, and means for controlling said motor to move said carriage until selected ones of said last named active and passive board contacts make electrical contact with each other.

3. A tuner comprising (a) a rectangular frame, (b) a printed circuit board fixedly mounted in said frame, (c) said circuit board having a plurality of regions extending laterally of said frame each allocated to a different frequency band.

(d) a plurality of tuned circuit elements for each of said bands including a group of circuit elements extending upwardly from said frame, each of said groups having the same spaced relationship in the region of said board allocated to its respective band, (e) a carriage mounted for movement longitudinally of said frame, a plurality of carriage circuit boards each depending from said carriage into the space between said groups of circuit elements on said fixedly mounted board, and (f) contact means extending from said carriage boards for making contact with the circuit on said fixedly mounted board.

4. The invention as set forth in claim 3 wherein said circuit boards carried on said carriage contain circuit elements disposed in the space between the underside of said carriage and the face of said last-named boards facing said underside.

5. The invention as set forth in claim 4 wherein said circuit elements mounted on said fixed board extend upwardly toward said carriage and occupy the space between said carriage circuit boards.

6. The invention as set forth in claim 5 wherein the circuits on said fixedly mounted board are passive tuned circuits and the circuits mounted on said carriage are active circuits which cooperate with said passive tuned circuits to form radio frequency amplifiers operative in different ones of said bands depending upon the position of said carriage.

7. The invention as set forth in claim 1 wherein lead screws are disposed in said frame running longitudinally along the edges thereof, said carriage having lead nuts in the outer ends thereof through which said screws are mounted, a motor carrying a shaft coupled to said lead screws for precisely translating said carriage.

8. The invention as set forth in claim 1 wherein said frame mounted board has a printed circuit on the side thereof facing said carriage, and has its said passive circuit elements mounted on the side thereof opposite said printed circuit side.

9. The invention as set forth in claim 8 wherein said carriage mounted board has a printed circuit on the side thereof facing said printed circuit side of said frame mounted board, active circuit elements being mounted on the side of said active board opposite to its said printed side, and wherein said contact elements are fixedly mounted on said printetd side of said active board and depend to contact the printed side of said passive board.

References Cited

UNITED STATES PATENTS

| | | | |
|---|---|---|---|
| 2,908,814 | 10/1959 | Bell | 325—464 |
| 3,290,604 | 12/1966 | Bell | 325—459 |
| 3,328,701 | 6/1967 | Rieth | 325—459 |
| 3,432,760 | 3/1969 | Andzer | 325—452 |

ROBERT L. GRIFFIN, Primary Examiner

A. J. MAYER, Assistant Examiner

U.S. Cl. X.R.

325—458, 459, 462, 464, 465, 471